United States Patent
Honda

(10) Patent No.: US 8,413,016 B2
(45) Date of Patent: Apr. 2, 2013

(54) NONVOLATILE MEMORY DEVICE AND CONTROLLER FOR JUDGING A NORMAL OR ANOMALOUS CONDITION OF AN ERROR-CORRECTED BIT PATTERN

(75) Inventor: Toshiyuki Honda, Kyoto (JP)

(73) Assignee: Panasonic Corporation, Osaka (JP)

( * ) Notice: Subject to any disclaimer, the term of this patent is extended or adjusted under 35 U.S.C. 154(b) by 388 days.

(21) Appl. No.: 12/768,171

(22) Filed: Apr. 27, 2010

(65) Prior Publication Data

US 2010/0275094 A1    Oct. 28, 2010

(30) Foreign Application Priority Data

Apr. 28, 2009    (JP) .................................. 2009-109189

(51) Int. Cl.
*G11C 29/00* (2006.01)
(52) U.S. Cl. ........................................................ 714/764
(58) Field of Classification Search .................. 714/763, 714/764, 766, 773; 711/102, 103; 365/185.29, 365/185.33
See application file for complete search history.

(56) References Cited

U.S. PATENT DOCUMENTS

| 8,145,855 | B2 * | 3/2012 | Wan et al. | 711/154 |
| 2006/0221692 | A1 * | 10/2006 | Chen | 365/185.11 |
| 2008/0215798 | A1 * | 9/2008 | Sharon et al. | 711/103 |
| 2009/0225597 | A1 * | 9/2009 | Shin et al. | 365/185.05 |
| 2009/0316490 | A1 | 12/2009 | Takada | |
| 2010/0070681 | A1 * | 3/2010 | Wan et al. | 711/103 |
| 2010/0229001 | A1 * | 9/2010 | Park et al. | 713/190 |

FOREIGN PATENT DOCUMENTS

| JP | 2007-241618 A | 9/2007 |
| JP | 2008-198299 A | 8/2008 |

* cited by examiner

*Primary Examiner* — Scott Baderman
*Assistant Examiner* — Joseph Kudirka
(74) *Attorney, Agent, or Firm* — Hamre, Schumann, Mueller & Larson, P.C.

(57) ABSTRACT

In a nonvolatile memory device of the present application, when data of each write unit is read from a nonvolatile memory, an all-clear detector detects whether the read data is already cleared, and a control portion judges whether a flag is already written into a written flag area of the data that has been descrambled by a descrambler and then corrected by an error detection and correction portion. Using a scramble pattern that is generated by a scramble pattern generator and corresponds to the written flag area, a predetermined bit pattern is scrambled to a state that differs from the cleared state.

8 Claims, 9 Drawing Sheets

| Written flag area | Judgment on presence or absence of flag ||
|---|---|---|
| | Descramble is performed | Descramble is not performed |
| All "1" | No flag is set | No flag is set |
| Neither [all "1"] nor [all "0"] | | Flag is set |
| All "0" | Flag is set | |

FIG. 8

NONVOLATILE MEMORY DEVICE AND CONTROLLER FOR JUDGING A NORMAL OR ANOMALOUS CONDITION OF AN ERROR-CORRECTED BIT PATTERN

BACKGROUND

1. Field

The present application relates to a nonvolatile memory device using a nonvolatile memory such as a flash memory. The present application relates to a nonvolatile memory controller that controls the nonvolatile memory.

2. Description of Related Art

A nonvolatile memory device incorporating a nonvolatile memory has been put to practical use as a memory card, and the market for memory cards of a digital camera and a portable telephone is expanding. The memory card increasingly has a larger capacity and higher speed so as to meet the increase in pixels of a digital camera and the recording of moving images or the like with a portable telephone.

The nonvolatile memory incorporated in the memory card is mainly a flash memory. In the flash memory, the size of a physical block, i.e., a clear unit is likely to increase as the capacity becomes larger. However, a management unit of the memory card is constant when viewed from the host and a user manipulating the host. Consequently, both the data management in the host and the data management in the flash memory need to be controlled by the control of a nonvolatile memory controller incorporated in the memory card.

In general, the management unit of data that is stored in the memory card by the host is smaller than the physical block (with a capacity of 256 kilobytes to 512 kilobytes) of the flash memory and can be, e.g., 16 kilobytes. Therefore, the nonvolatile memory controller controls a state in which data is written halfway through the physical block.

JP 2007-241618 A discloses a semiconductor memory device including a nonvolatile memory controller that has an error correction function to improve the reliability of a nonvolatile memory device. In the semiconductor memory device of JP 2007-241618 A, an error-correcting code is attached to data when it is written into the nonvolatile memory, and an error correction is performed when the data is read along with the error-correcting code from the nonvolatile memory. This error correction function also is performed to detect a power shutdown of the nonvolatile memory device during the writing of data into the nonvolatile memory. Thus, the semiconductor memory device of JP 2007-241618 A can detect an abnormal operation in which the error correction cannot be performed since anomalous data is written into the nonvolatile memory due to a power shutdown during writing, and also can detect an abnormal operation in which a power shutdown occurs probabilistically based on a written mark.

JP 2008-198299 A discloses a semiconductor memory device including a nonvolatile memory controller that has a scramble function to improve the reliability of a nonvolatile memory. In the semiconductor memory device of JP 2008-198299 A, scrambled data is written into the nonvolatile memory.

The detection of the abnormal operation due to a power shutdown using the written mark disclosed in JP 2007-241618 A is achieved by writing fixed data into the nonvolatile memory. Therefore, it is not appropriate for the data scramble technology applied as the background of JP 2008-198299 to be used in the technology of JP 2007-241618 A. Although JP 2007-241618 A and JP 2008-198299 A teach the technologies for improving the data reliability, it is difficult to use both technologies simultaneously.

SUMMARY

A nonvolatile memory controller disclosed in the present application includes the following: an error-correcting code generator that generates an error-correcting code when data is written into a nonvolatile memory; an error detection and correction portion that detects an error in data including the error-correcting code and corrects the error when data is read from the nonvolatile memory; a nonvolatile buffer memory that temporarily stores data to be written into the nonvolatile memory and data read from the nonvolatile memory; a scrambler that scrambles data to be written with a scramble pattern generated by a scramble pattern generator when the data to be written is transferred between the nonvolatile memory and the buffer memory; and a control portion that controls each of the components. When data is written into each write unit of the nonvolatile memory, the control portion controls so that the scrambled data to be written, a written flag serving as a bit pattern that differs from write unit to write unit, and the error-correcting code generated by the error-correcting code generator based on the scrambled data to be written and the written flag are written. When data of each write unit is read from the nonvolatile memory, the control portion decides whether data is normal or anomalous by judging whether a written flag area of the data after an error is corrected by the error detection and correction portion has the predetermined bit pattern.

A nonvolatile memory device disclosed in the present application includes a nonvolatile memory that includes a storage area composed of a plurality of write units, stores data, and further includes an area for storing a written flag area in each of the write units, and a nonvolatile memory controller. The nonvolatile memory controller includes the following: an error-correcting code generator that generates an error-correcting code when data is written into the nonvolatile memory; an error detection and correction portion that detects an error in data including the error-correcting code and corrects the error when data is read from the nonvolatile memory; a nonvolatile buffer memory that temporarily stores data to be written into the nonvolatile memory and data read from the nonvolatile memory; a scrambler that scrambles data to be written with a scramble pattern generated by a scramble pattern generator when the data to be written is transferred between the nonvolatile memory and the buffer memory; and a control portion that controls each of the components. When data is written into each write unit of the nonvolatile memory, the control portion controls so that the scrambled data to be written, a written flag serving as a bit pattern that differs from write unit to write unit, and the error-correcting code generated by the error-correcting code generator based on the scrambled data to be written and the written flag are written. When data of each write unit is read from the nonvolatile memory, the control portion decides whether data is normal or anomalous by judging whether the written flag area of the data after an error is corrected by the error detection and correction portion has the predetermined bit pattern.

BRIEF DESCRIPTION OF THE DRAWINGS

FIG. 8 is shows a flag judgment depending on the presence or absence of scramble.

DETAILED DESCRIPTION OF THE EMBODIMENTS

Embodiment 1

1. Configuration of Nonvolatile Memory Device

Embodiment 1 of a nonvolatile memory device will be described below.

Figure 1:
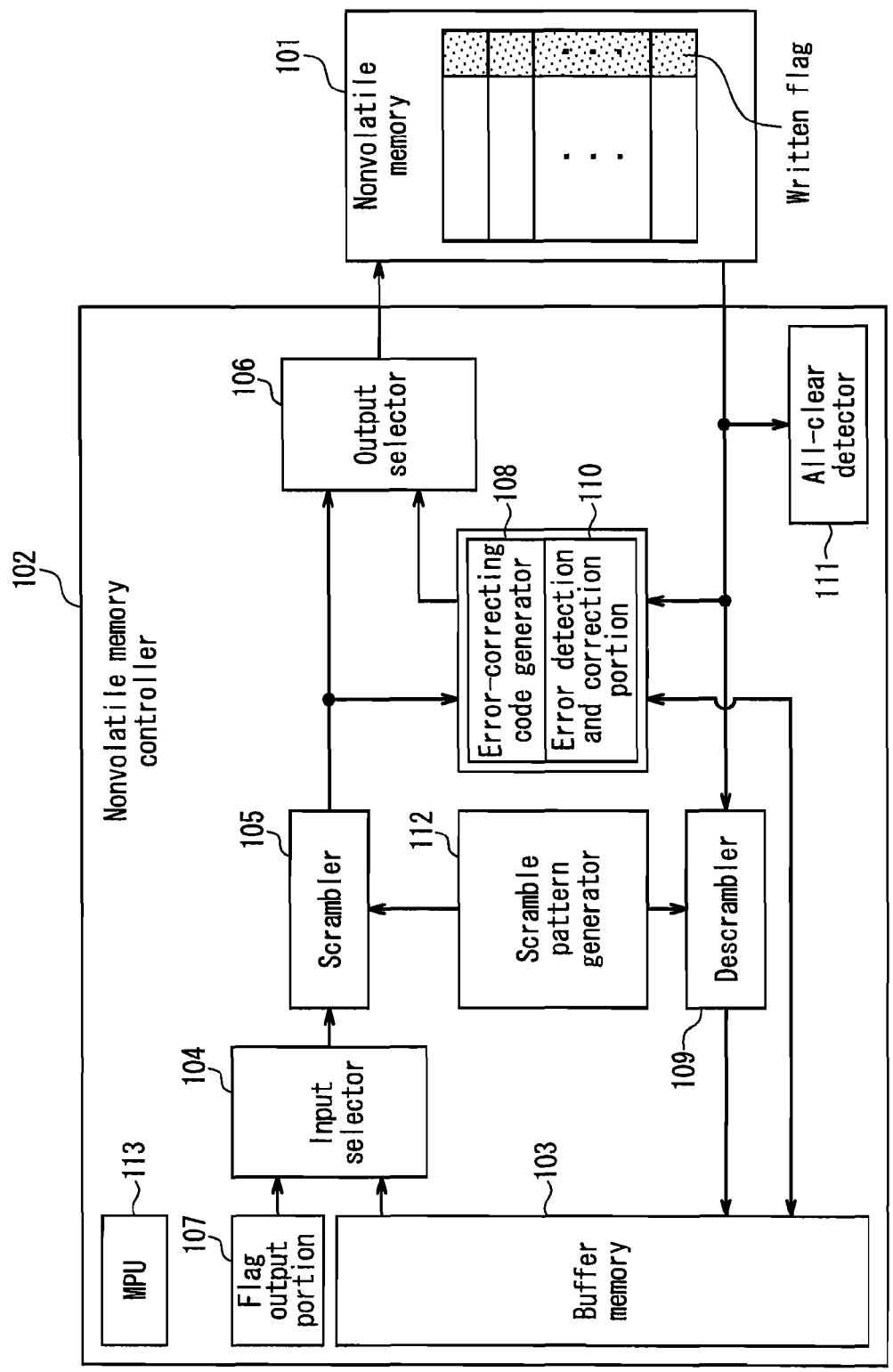
FIG. 1 is a block diagram of a nonvolatile memory device according to Embodiment 1.

FIG. 1 is a block diagram of the nonvolatile memory device according to Embodiment 1. A nonvolatile memory 101 shown in FIG. 1 is an example of the nonvolatile memory device. A nonvolatile memory controller 102 includes a buffer memory 103, an input selector 104, a scrambler 105, an output selector 106, a flag output portion 107, an error-correcting code generator 108, a descrambler 109, an error detection and correction portion 110, an all-clear detector 111, a scramble pattern generator 112, and a MPU (microprocessor unit) 113.

The nonvolatile memory 101 is a flash memory that enables nonvolatile storage of data.

The nonvolatile memory controller 102 can control the nonvolatile memory 101.

The buffer memory 103 stores data to be written into the nonvolatile memory 101 and data read from the nonvolatile memory 101.

When data is written from the nonvolatile memory controller 102 to the nonvolatile memory 101, the data stored in the buffer memory 103 is transferred to the nonvolatile memory 101 via the input selector 104, the scrambler 105, and the output selector 106.

The input selector 104 selects either the data read from the buffer memory 103 or the data output from the flag output portion 107 and sends the selected data to the scrambler 105.

The scrambler 105 scrambles the data sent from the input selector 104. The scrambler 105 sends the scrambled data to the output selector 106 and the error-correcting code generator 108.

The output selector 106 selects either the data sent from the scrambler 105 or the data sent from the error-correcting code generator 108 and sends the selected data to the nonvolatile memory 101.

The flag output portion 107 outputs flag information.

The error-correcting code generator 108 generates an error-correcting code. The error-correcting code generator 108 attaches the error-correcting code to the data sent from the scrambler 105.

The descrambler 109 descrambles the scrambled data sent from the nonvolatile memory 101. In other words, the descrambler 109 performs an operation to restore the scrambled data to data before the scramble operation.

When the error detection and correction portion 110 detects an error based on the data read from the nonvolatile memory 101 and the error-correcting code, the error detection and correction portion 110 reads erroneous data from the data written into the buffer memory 103, corrects the error in the read data, and writes the corrected data back into the buffer memory 103. The error-correcting code used in the error-correcting code generator 108 and the error detection and correction portion 110 is, e.g., a BCH code or RS (Reed-Solomon) code, but can be any other error-correcting code. In this case, the error-correcting code is determined to allow the error detection and correction portion 110 to judge that "there is not a single error bit" if the data read from the nonvolatile memory 101 is all cleared (set to all "1"). This error-correcting code is required to improve the performance of detecting an anomaly due to a power shutdown during the writing of data into the nonvolatile memory 101. By encoding the data so that the all-clear state is judged as "no error", when the number of bits where the data has been cleared and then written is not more than the number of errors that can be corrected by an error correction circuit, the anomaly can be detected reliably.

When data is written from the nonvolatile memory controller 102 to the nonvolatile memory 101, the data stored in the buffer memory 103 is transferred to the nonvolatile memory 101 via the input selector 104, the scrambler 105, and the output selector 106.

When data is read from the nonvolatile memory 101 to the nonvolatile memory controller 102, the data read from the nonvolatile memory 101 is transferred to the buffer memory 103 via the descrambler 109. The data read from the nonvolatile memory 101 is sent to the error detection and correction portion 110 and the all-clear detector 111.

The scramble pattern generator 112 gives scramble patterns to the scrambler 105 and the descrambler 109 when data is written into the nonvolatile memory 101 and when data is read from the nonvolatile memory 101, respectively. The "scramble operation" as described in the present specification means the conversion of data before scramble into data that differs from the data before scramble, and also indicates a reversible operation that can restore the scrambled pattern to the pattern before scramble by descrambling. As an example of a simple scramble operation, there is a method for obtaining the exclusive OR of a pattern to be scrambled and a pattern generated by the scramble pattern generator 112. Specifically, when data before scramble, e.g., "00000000" is scrambled using a scramble pattern of "01010011", the resultant data is "01010011" that differs from the data before scramble. When the scrambled data "01010011" is descrambled using a descramble pattern of "01010011", the resultant data is "00000000" that is the same pattern as that of the data before scramble. This is an example of the scramble operation, and the use of other methods is not a problem as long as the reversible operation can be performed.

The MPU 113 performs the whole operation of the nonvolatile memory controller 102.

Figure 2:
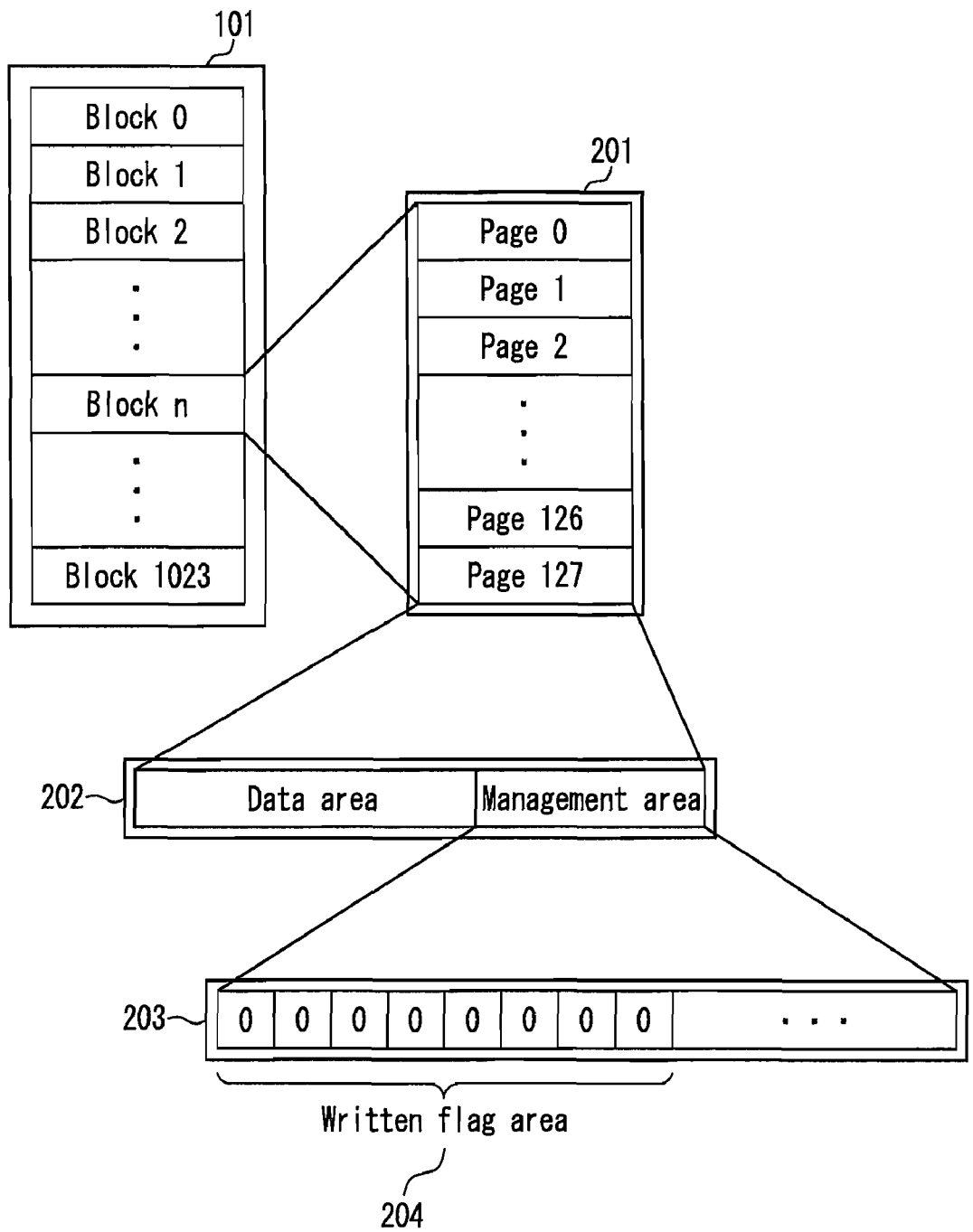
FIG. 2 is a schematic view showing a structure of data written into a nonvolatile memory.

FIG. 2 is a schematic view showing a structure of data written into the nonvolatile memory 101.

The nonvolatile memory 101 includes a plurality of physical blocks 201. Each of the physical blocks 201 is a clear unit of data in the nonvolatile memory 101. Moreover, each of the physical blocks 201 includes a plurality of physical pages 202. Each of the physical pages 202 is a write unit of data in the nonvolatile memory 101. Moreover, each of the physical pages 202 includes a data area and a management area 203. The data to be written into the management area 203 may be, e.g., an error-correcting code, management information, a written flag, or the like. The error-correcting code corresponds to data in the data area. The management information is used for the nonvolatile memory controller 102 to manage the logical storage structure of data in the nonvolatile memory 101. The written flag is written into a written flag area 204 in the management area 203.

In the nonvolatile memory 101 serving as a flash memory, the cleared data generally is represented by "1", and therefore only data "0" can be written. That is, to write data "1" into the location where data "0" is already written, the data "0" needs to be cleared first and then rewritten as data "1". Such a data clearing operation is performed for each physical block 201.

2. Operation of Writing Data into Nonvolatile Memory

Referring to FIGS. 1 and 2, the operation of writing data into the nonvolatile memory 101 and the operation of reading data from the nonvolatile memory 101 will be described. The MPU 113 controls the nonvolatile memory controller 102, thereby controlling the data write operation and the data read operation.

When data is written into each of the physical pages 202 of the nonvolatile memory 101, first, in order to transfer data to the data area of the nonvolatile memory 101, the nonvolatile memory controller 102 reads data that is to be written into the nonvolatile memory 101 from the data stored in the buffer memory 103. The data read from the buffer memory 103 is sent to the input selector 104. The input selector 104 sends the data read from the buffer memory 103 to the scrambler 105.

The scrambler 105 scrambles the data sent from the input selector 104 based on the scramble pattern generated by the scramble pattern generator 112. The scrambler 105 sends the scrambled data to the output selector 106 and the error correcting code generator 108. The scramble pattern generator 112 generates scramble patterns that differ from physical page to physical page so that the data is varied by scrambling.

The output selector 106 sends the data output from the scrambler 105 to the nonvolatile memory 101. Therefore, the data that is read from the buffer memory 103 and scrambled with the scramble pattern generated by the scramble pattern generator 112 is written into the data area of the nonvolatile memory 101. The error-correcting code generated by the error-correcting code generator 108 is the data after the scramble operation by the scrambler 105 and also is the same as the data written into the nonvolatile memory 101.

Next, in order to transfer the written flag to the written flag area 204 of the nonvolatile memory 101, the input selector 104 selects the data output from the flag output portion 107 and sends it to the scrambler 105. The flag output portion 107 outputs "0", which is a value indicating that the data is not yet cleared in the flash memory.

The scrambler 105 scrambles the data sent from the input selector 104 based on the scramble pattern generated by the scramble pattern generator 112. The scrambler 105 sends the scrambled data to the output selector 106 and the error-correcting code generator 108. The scramble pattern generator 112 generates a scramble pattern other than a specific pattern when the input selector 104 selects the data of the flag output portion 107. The "specific pattern" is a scramble pattern consisting of all "1".

The output selector 106 selects the data sent from the scrambler 105 and sends it to the nonvolatile memory 101. Therefore, the data that is output from the flag output portion 107 and scrambled with the scramble pattern generated by the scramble pattern generator 112 is sent to the written flag area 204 of the nonvolatile memory 101. The error-correcting code generated by the error-correcting code generator 108 is the data after the scramble operation by the scrambler 105 and also is the same as the data written into the nonvolatile memory 101.

The nonvolatile memory controller 102 also writes management information into the location other than the written flag area 204 in the management area 203 of the nonvolatile memory 101. The explanation of the write operation of the management information into the location other than the written flag area 204 will be omitted.

In order to transfer the error-correcting code to the management area 203, the output selector 106 selects the error-correcting code as a result of the operation of the error-correcting code generator 108 and sends it to the nonvolatile memory 101. The error-correcting code generated by the error-correcting code generator 108 is the data after the scramble operation by the scrambler 105 and also is the same as the data written into the nonvolatile memory 101.

Figure 3:
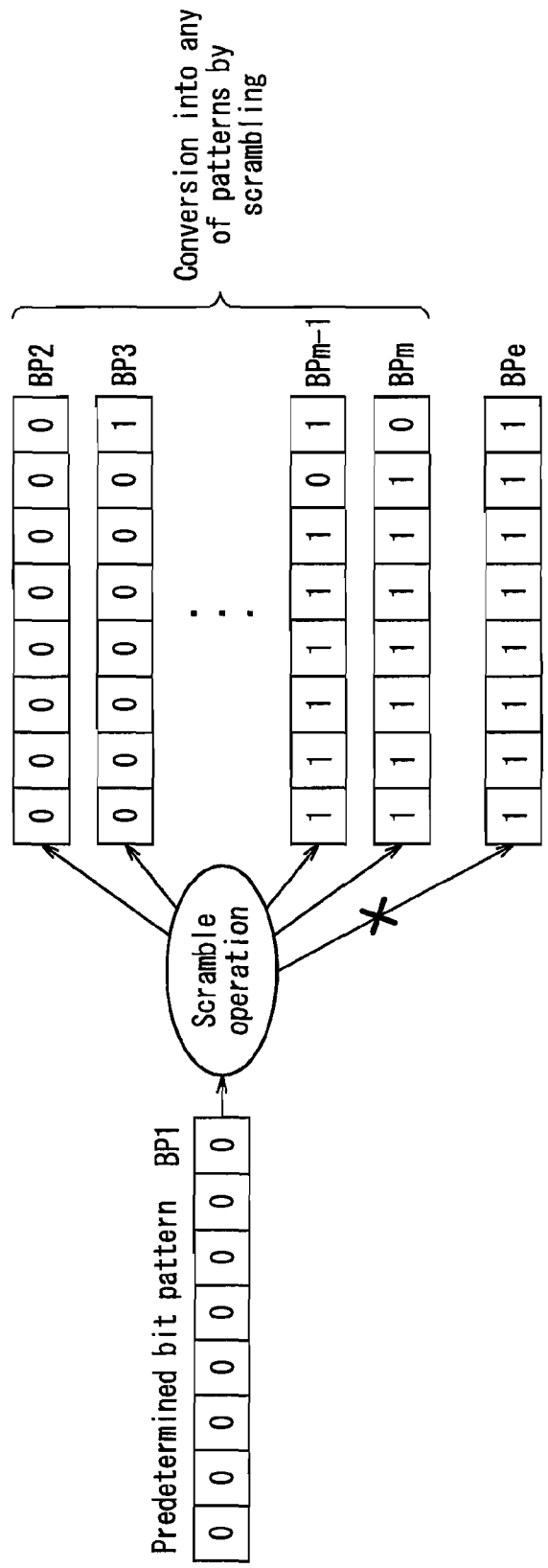
FIG. 3 is a schematic view showing a scramble operation of a written flag.

FIG. 3 is a schematic view showing a state of the written flag area 204 when data is written into the nonvolatile memory 101. A predetermined bit pattern BP1 is a bit pattern of the written flag output from the flag output portion 107 before scramble. The "scramble operation" shown in FIG. 3 is performed by the scrambler 105 (see FIG. 1) with the scramble pattern generated by the scramble pattern generator 112 (see FIG. 1). Bit patterns BP2 to BPm are bit patterns after the scramble operation. The scramble pattern generator 112 may generate various scramble patterns, and therefore there is a possibility that a variety of bit patterns will be provided after the scramble operation. However, since the scramble pattern generator 112 does not generate the specific pattern (i.e., a scramble pattern consisting of all "1"), the scrambler 105 does not convert the bit pattern BP1 into a bit pattern consisting of all "1", namely a bit pattern BPe. In other words, the data having a bit pattern consisting of all "1" will not be written into the written flag area 204 of the nonvolatile memory 101. Accordingly, the bit pattern of data to be written into the written flag area 204 is not a bit pattern consisting of all "1", which indicates that the data is cleared already.

As described above, the scramble pattern generator 112 generates scramble patterns that differ from page to page. Thus, the nonvolatile memory controller 102 writes the patterns that differ from page to page and also indicate that the data is not yet cleared into the written flag area 204 of the nonvolatile memory 101.

3. Operation of Reading Data from Nonvolatile Memory

When data is read from each of the physical pages 202 of the nonvolatile memory 101, the MPU 113 controls so that data written into the data area of the nonvolatile memory 101 is read first and then transferred to the descrambler 109, the error detection and correction portion 110, and the all-clear detector 111. The descrambler 109 descrambles the data read from the data area based on the scramble pattern generated by the scramble pattern generator 112. The descrambler 109 writes the descrambled data into the buffer memory 103. The data written into the buffer memory 103 by the descrambler 109 is the same as the data that is read from the buffer memory 103 so as to be written into the nonvolatile memory 101, except for the portion of a bit error that may occur in the nonvolatile memory 101.

Next, the MPU 113 controls so that data written into the written flag area 204 of the nonvolatile memory 101 is read and then transferred to the descrambler 109, the error detection and correction portion 110, and the all-clear detector 111. The descrambler 109 descrambles the data read from the written flag area 204 based on the scramble pattern generated by the scramble pattern generator 112. The descrambler 109 writes the descrambled data into the buffer memory 103. The data written into the buffer memory 103 after the descramble operation is the same as the data having a bit pattern consisting of all "0" that is output from the flag output portion 107, except for the portion of a bit error that may occur in the nonvolatile memory 101.

Next, the MPU 113 controls so that data in the management area 203 other than the written flag area 204 of the nonvolatile memory 101 is read and then transferred to the error detection and correction portion 110 and the all-clear detector 111.

Figure 6:
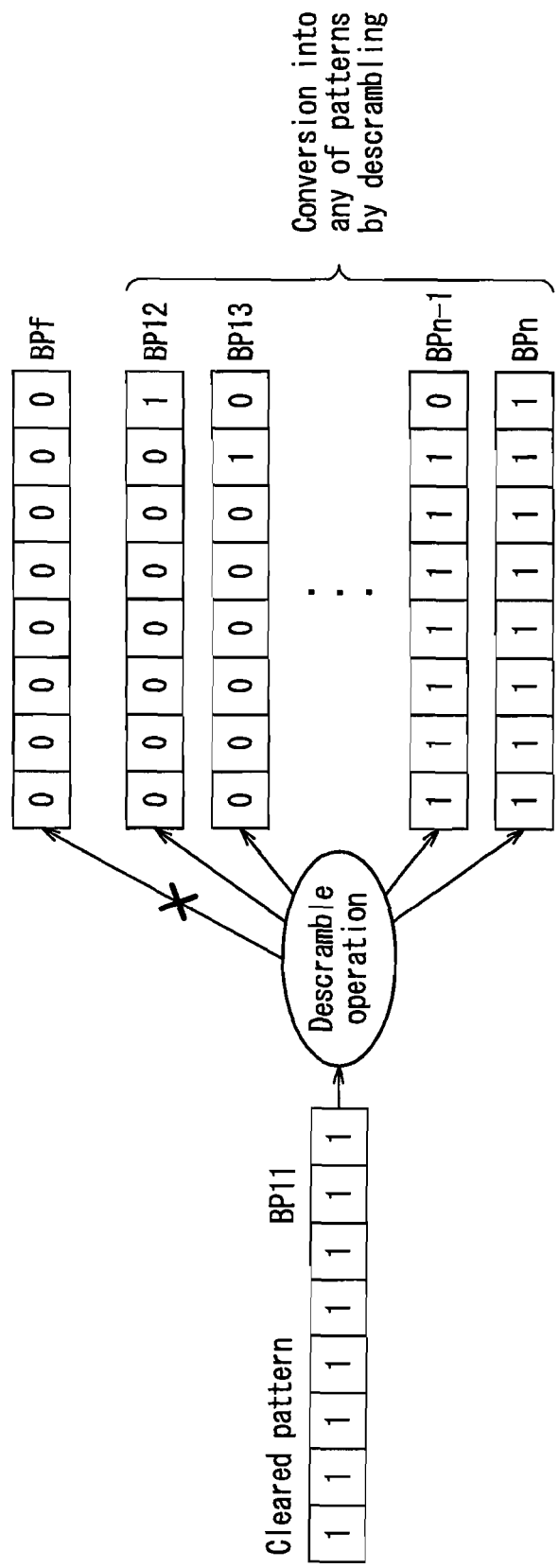
FIG. 6 is a schematic view showing a descramble operation of a written flag that is already cleared.

After the data is read from the nonvolatile memory 101, the MPU 113 performs two judgment operations. In the first judgment operation, the MPU 113 decides whether the data read from the nonvolatile memory 101 has no error, a correctable error, or an uncorrectable error based on the result of the operation of the error detection and correction portion 110. In the second judgment operation, the MPU 113 decides whether the bit pattern of the data read from the nonvolatile memory 101 consists of all "1" based on the result of the detection of the all-clear detector 111. The all-clear detector 111 can be achieved, e.g., by the circuit as shown in FIG. 6 of JP 2007-241618 A.

Figure 4:
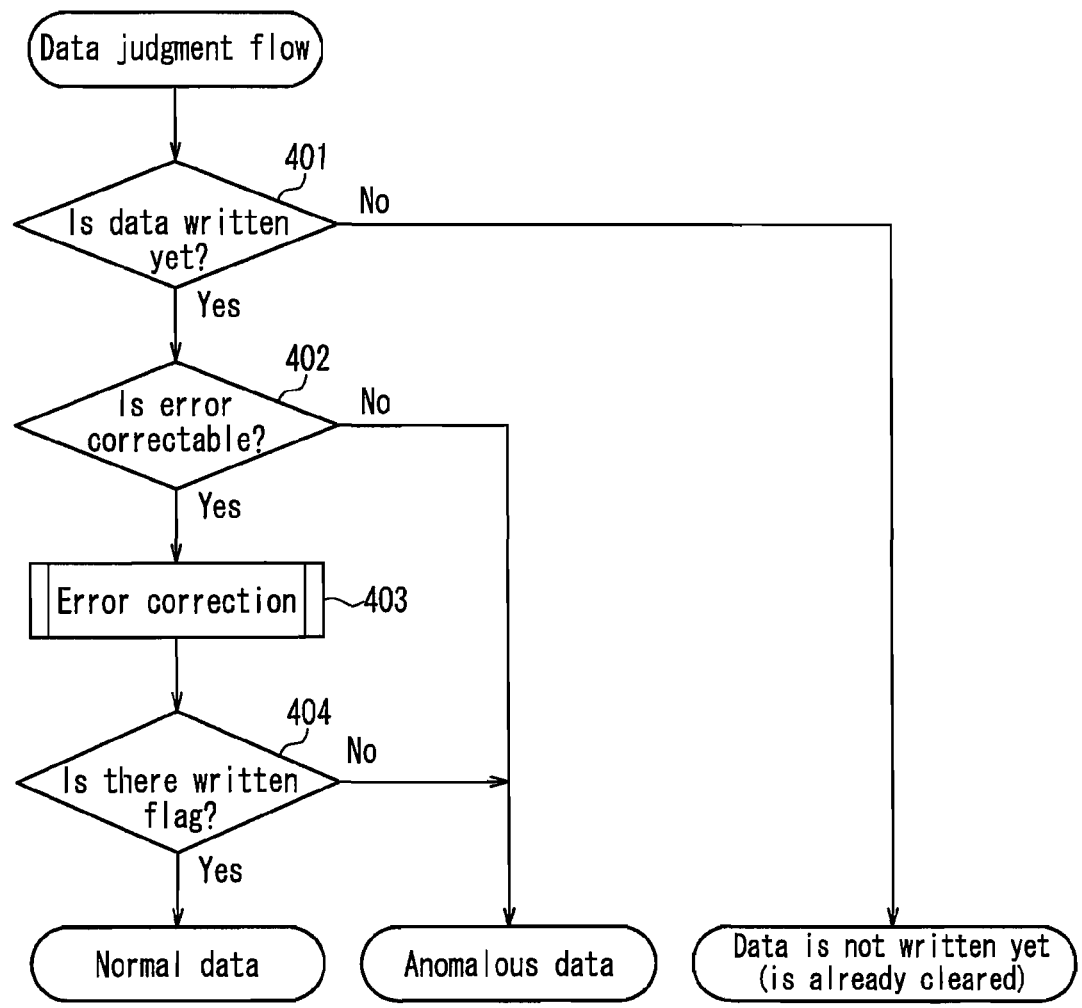
FIG. 4 is a flowchart for a data judgment operation of a nonvolatile memory device according to Embodiment 1.

FIG. 4 is a flowchart for detecting an anomaly of data due to a power shutdown that may occur while the data is written into the nonvolatile memory 101.

First, the MPU 113 judges whether the data read from the nonvolatile memory 101 is already written (a judgment operation 401). Specifically, when the MPU 113 refers to the detection result of the all-clear detector 111 and finds that the bit pattern of the data read from the nonvolatile memory 101 consists of all "1" (i.e., "No" in the judgment operation 401), the MPU 113 decides that the data is not written yet.

On the other hand, if the MPU 113 decides that some data is included in the data read from the nonvolatile memory 101 (i.e., "Yes" in the judgment operation 401), the MPU 113 further judges whether the data read from the nonvolatile memory 101 is correctable (a judgment operation 402). The MPU 113 uses the result of the operation of the error detection and correction portion 110 to determine whether an error in the data is correctable. If the MPU 113 finds that the error in the data read from the nonvolatile memory 101 is not correctable (i.e., "No" in the judgment operation 402), the MPU 113 decides that the data is "anomalous data".

The probability of an uncorrectable error occurring is extremely low in view of the performance of the nonvolatile memory 101 if the data is written properly into the nonvolatile memory 101. Since the correction capability of the error correction circuit is determined to prevent the occurrence of an uncorrectable error, when the MPU 113 decides that "the data read from the nonvolatile memory 101 has an error that cannot be corrected by the error detection and correction portion 110", it is evident that the data is anomalous data due to a power shutdown or the like during the writing of the data into the nonvolatile memory 101. Moreover, when the data read from the nonvolatile memory 101 is anomalous data, there is an extremely high probability that the error correction cannot be performed.

For example, when an 8-bit correctable BCH code is attached to 512-byte data, the necessary bits for the error-correcting code are 104 bits. The probability P that the error correction can be performed on random data, which is an example of the anomalous data, can be calculated based on all the error correctable patterns $BP_{ER}$ and all the possible patterns $BP_{AL}$.

$$P=BP_{ER}/BP_{AL}$$

All the error correctable patterns $BP_{ER}$ can be calculated based on all the possible patterns $BP_{512}$ of the 512-byte data and the number of error combinations ER represented by 0 to 8 bits.

$$BP_{ER}=BP_{512}/ER$$

The number of the latter part of combinations is approximately $2\times10^{24}$.

All the possible patterns $BP_{AL}$ can be calculated based on all the possible patterns $BP_{512}$ of the 512-byte data and all the possible patterns $BP_{104}$ of 104 bits.

$$BP_{AL}=BP_{512}/BP_{104}$$

The number of the latter part of patterns is approximately $2\times10^{31}$. Therefore, the probability of being able to correct random patterns is $1/10^7$, which is extremely low. In other words, the probability that the random data can be judged as anomalous is nearly 100%.

Next, if the MPU 113 finds that the data read from the nonvolatile memory 101 is correctable (i.e., "Yes" in the judgment operation 402), the MPU 113 controls so that the error detection and correction portion 110 corrects the data in the buffer memory 103 (an operation 403). In this case, when the MPU 113 finds that the bits corresponding to the written flag are in error and can be corrected, those error bits stored in the buffer memory 103 are corrected.

Next, the MPU 113 judges whether the written flag is set properly at the location in the buffer memory 103 that corresponds to the written flag area. That is, the MPU 113 judges whether the written flag consists of all "0" (a judgment operation 404).

Figure 5:
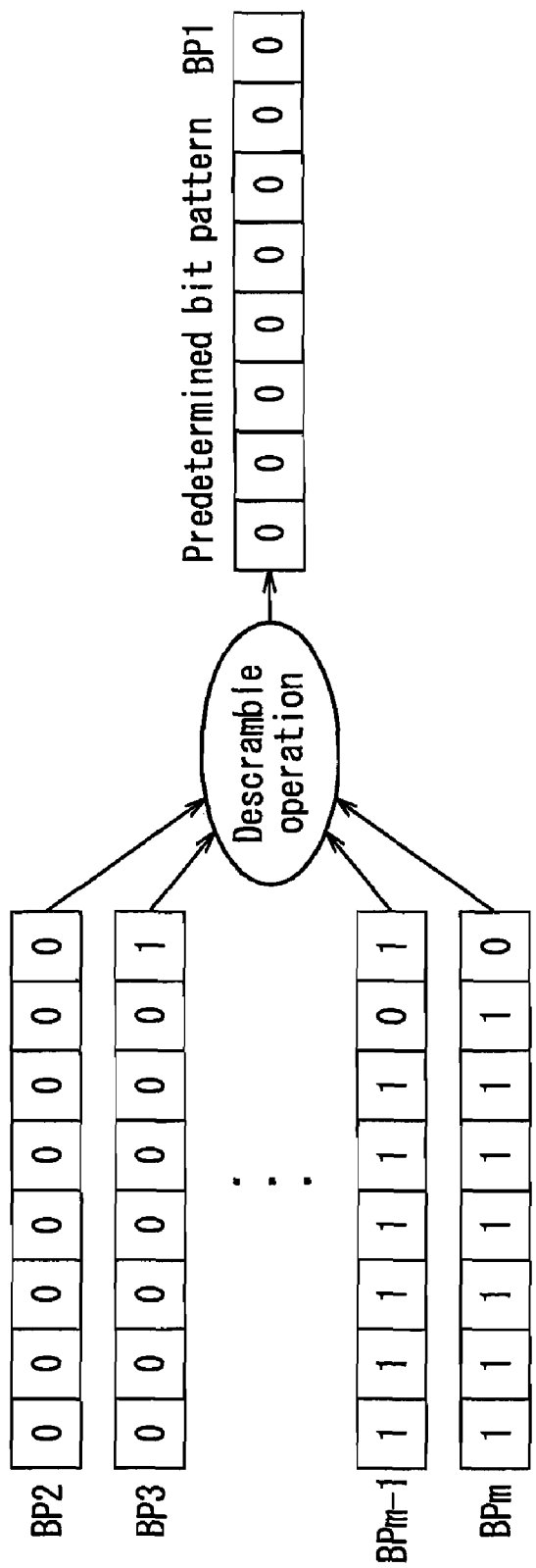
FIG. 5 is a schematic view showing a descramble operation of a written flag.

FIG. 5 is a schematic view showing a state of the written flag after reading the data that has been written properly into the nonvolatile memory 101. All the bit patterns BP2 to BPm (into which the predetermined bit pattern BP1 may be converted) shown in FIG. 3 are listed in FIG. 5. The descrambler 109 shown in FIG. 1 performs the descramble operation with the scramble pattern generated by the scramble pattern generator 112. A predetermined bit pattern BP1 shown in FIG. 5 is a bit pattern after the descramble operation. When the descrambler 109 performs the descramble operation properly, the bit patterns BP2 to BPm are restored to the predetermined bit pattern BP1. In other words, if the bit pattern after the descramble operation consists of all "0" (the bit pattern BP1), the MPU 113 selects "Yes" in the judgment operation 404 in FIG. 4 and decides that "the data is normal".

FIG. 6 is a schematic view showing a state of the written flag after reading the data that has been cleared and not written yet. A bit pattern BP11 shown in FIG. 6 is a bit pattern in the written flag area 204 of the physical page that has been cleared and not written yet in the nonvolatile memory 101. Bit patterns BP12 to BPn are bit patterns after the descramble operation.

When the descrambler 109 performs the descramble operation properly with the descramble pattern, it converts the bit pattern BP11 into bit patterns other than the bit pattern consisting of all "0" (the bit pattern BPf). For example, the descrambler 109 converts the bit pattern BP11 into any of the bit patterns BP12 to BPn. Consequently, since none of the descrambled bit patterns consist of all "0", the MPU 113 selects "No" in the judgment operation 404 and decides that "the data is anomalous".

At the time a data anomaly occurs due to a power shutdown or the like while the data is written into the nonvolatile memory 101, if the written bit is in the range of one to the number of bits that can be corrected by the error correction, the MPU 113 decides that the data is already written based on the detection result of the all-clear detector 111 and that the error in the data can be corrected by the error detection and correction portion 110. Moreover, after correcting the data in the buffer memory 103, since none of the bit patterns are the predetermined bit pattern consisting of all "0", the MPU 113 decides that "no flag is set", which means anomalous data.

When it is expected that a power shutdown occurred during the writing of data into the nonvolatile memory 101, even if the number of bits where the data had been written immediately before the power shutdown can be corrected by the error detection and correction portion 110, the data read from the nonvolatile memory 101 is handled as anomalous data.

Similarly, at the time a data anomaly occurs due to a power shutdown or the like while the data is written into the nonvolatile memory 101, if the written bit is more than the number of bits that can be corrected by the error correction, these bits can be considered to be the same as a random data pattern. Therefore, it is highly probable that the error in the data will not be correctable (i.e., "No" in the judgment operation 403 in FIG. 4), which means anomalous data.

Figure 7:
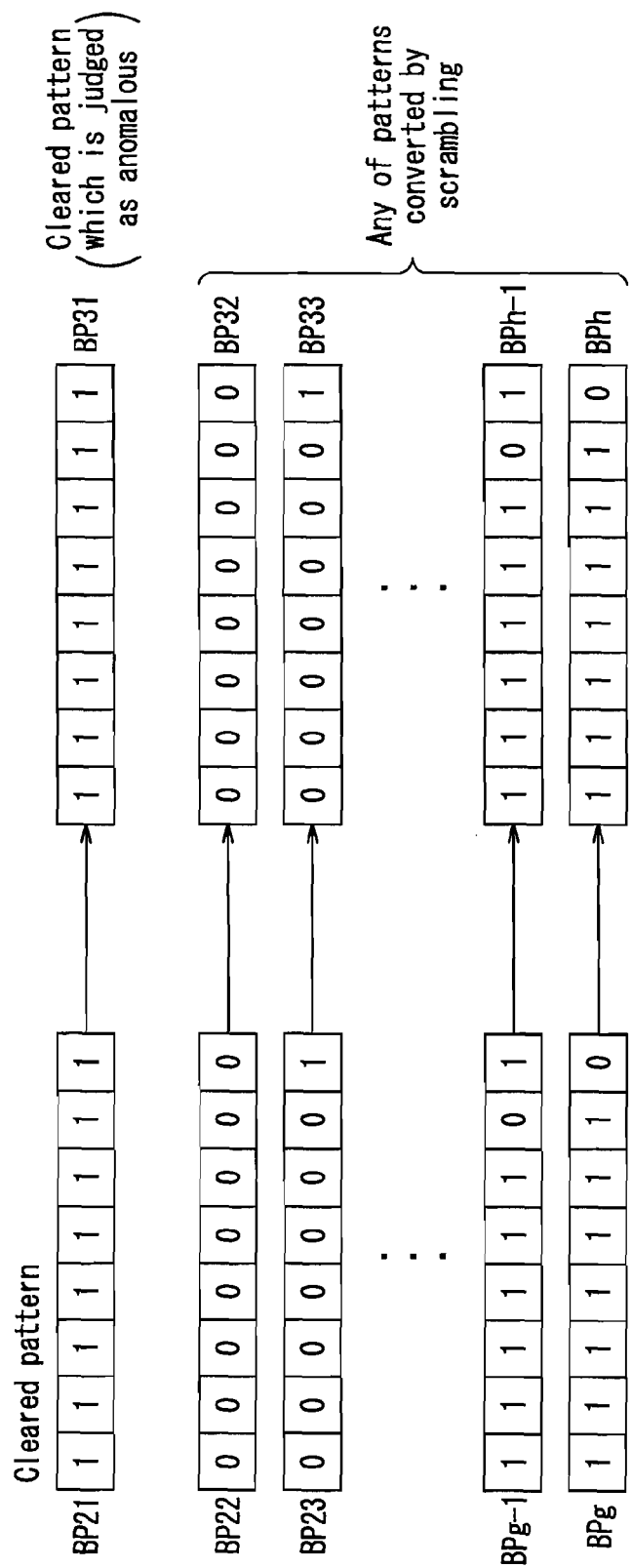
FIG. 7 is a schematic view showing a state in which no descramble operation of a written flag is performed.

FIG. 7 is a schematic view showing a state of the written flag that is read from the nonvolatile memory 101 and not descrambled by the descrambler 109. The written flag shown in FIG. 7 is provided on the assumption that the scramble pattern corresponding to the data read from the nonvolatile memory 101 is unclear. In such a case, the data is transferred to the buffer memory 103 without performing the descramble operation.

A bit pattern BP21 is a cleared pattern. Bit patterns BP22 to BPg may be obtained after performing the scramble operation on the predetermined bit pattern consisting of all "0" by the scrambler 105. The cleared bit pattern BP21 is read as a bit pattern BP31 consisting of all "1" without any conversion. The bit patterns BP22 to BPg are read as bit patterns BP32 to BPh, none of which consist of all "1". The MPU 113 judges only the pattern consisting of all "1" as "no flag" in the judgment operation 404 of the flowchart shown in FIG. 4, and thus can identify the anomalous data correctly.

FIG. 8 is a table that classifies the criteria for the judgment operation 404 shown in FIG. 4 depending on the presence or absence of the descramble operation.

In this embodiment, the written flag area is provided in the nonvolatile memory 101, the scramble pattern is used for the written flag area during writing, and the flag judgment is performed during reading. Thus, it is possible to detect an anomaly of data due to a power shutdown that may occur while the data is written into the nonvolatile memory by using the scramble operation.

Embodiment 2

Embodiment 2 of a nonvolatile memory device and a nonvolatile memory controller will be described below.

The nonvolatile memory device and the nonvolatile memory can have the same configuration as that in Embodiment 1. However, the nonvolatile memory controller of Embodiment 2 does not use the all-clear detector 111 for data processing. The scramble patterns generated by the scramble pattern generator 112 are the same as those in Embodiment 1. The operations of the scrambler 105 and the descrambler 109 are the same as those in Embodiment 1.

The nonvolatile memory controller of Embodiment 2 differs from that of Embodiment 1 in the following point. When it is expected that a power shutdown occurred during the writing of data into the nonvolatile memory 101, if the number of bits where the data had been written immediately before the power shutdown can be corrected by the error detection and correction portion 110, the data is not handled as anomalous data, but decided as "unwritten data".

This decision is made to deal with the case in which the data reliability is reduced because of a fine-line process of the nonvolatile memory, and thus a bit error is present even in the page that has been cleared and not written yet.

A flowchart for detecting an anomaly caused by a power shutdown in Embodiment 2 differs from the flowchart for anomaly detection in Embodiment 1.

Figure 9:
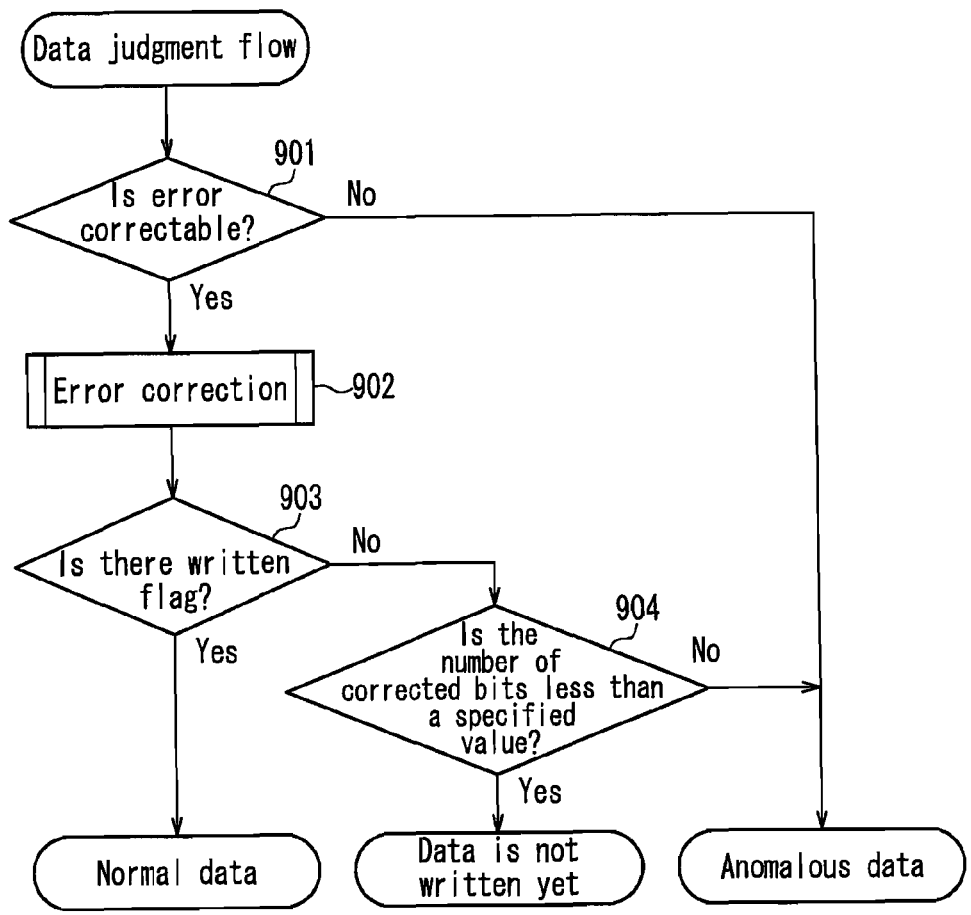
FIG. 9 is a flowchart showing a data judgment operation of a nonvolatile memory device according to Embodiment 2.

FIG. 9 shows the flowchart for detecting an anomaly of data due to a power shutdown in Embodiment 2.

First, the MPU 113 judges whether the data read from the nonvolatile memory 101 is correctable (a judgment operation 901). This judgment operation uses the result of the operation of the error detection and correction portion 110. If the MPU 113 finds that the error in the data is not correctable (i.e., "No" in the judgment operation 901), the MPU 113 decides that the data read from the nonvolatile memory 101 is "anomalous data". The probability of an uncorrectable error occurring is extremely low in view of the performance of the nonvolatile memory 101 if the data is written properly into the nonvolatile memory 101.

On the other hand, if the MPU 113 finds that the data is correctable (i.e., "Yes" in the judgment operation 901), the MPU 113 controls so that the error detection and correction portion 110 corrects the data in the buffer memory 103 (an operation 902). In this case, when the MPU 113 finds that the bits corresponding to the written flag are in error and can be corrected, it controls so that those error bits stored in the buffer memory 103 are corrected.

Next, the MPU 113 judges whether the flag is set properly at the location in the buffer memory 103 that corresponds to the written flag area (a judgment operation 903). That is, the MPU 113 judges whether the flag consists of all "0". If the flag consists of all "0" (i.e., "Yes" in the judgment operation 903), the MPU 113 decides that "the data is normal".

At the time a data anomaly occurs due to a power shutdown or the like while the data is written into the nonvolatile memory 101, if the written bit is in the range of one to the number of bits that can be corrected by the error correction, the following operations are performed. The MPU 113 decides that the error in the data can be corrected by the error detection and correction portion 110 (the judgment operation 901). Moreover, after correcting the data in the buffer memory 103 (the operation 902), since none of the bit patterns are the predetermined bit pattern consisting of all "0", the MPU 113 decides that "no flag is set" (the judgment operation 903) and performs a judgment operation 904.

The MPU 113 compares the number of bits that are corrected by the error correction in the error detection and correction portion 110 with a specified value (the judgment operation 904). If the number of corrected bits is less than the specified value, the MPU 113 decides that the data is not written yet. The decision is made because even if data is overwritten in this page, it is considered that the number of error bits still can be corrected. On the other hand, if the number of corrected bits is not less than the specified value, the MPU 113 decides that the data is "anomalous data". The decision is made because even if data is overwritten in this page, it is considered that the expected data reliability cannot be obtained since the number of error bits is large.

The error-correcting code generator 108 in this embodiment is an example of the error-correcting code generator of the present invention. The error detection and correction portion 110 in this embodiment is an example of the error detection and correction portion of the present invention. The buffer memory 103 in this embodiment is an example of the buffer memory of the present invention. The scrambler 105 in this embodiment is an example of the scrambler of the present invention. The MPU 113 in this embodiment is an example of the controller of the present invention. The all-clear detector 111 in this embodiment is an example of the all-clear detector of the present invention. The nonvolatile memory controller 102 in this embodiment is an example of the nonvolatile memory controller of the present invention. The nonvolatile memory 101 and the nonvolatile memory controller 102 in this embodiment are an example of the nonvolatile memory device of the present invention.

The nonvolatile memory device of the present application further can improve the data reliability for the host and thus can be applied to a storage medium in portable equipment.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A nonvolatile memory controller comprising:
an error-correcting code generator that generates an error-correcting code when data is written into a nonvolatile memory;
an error detection and correction portion that detects an error in data including the error-correcting code and corrects the error when data is read from the nonvolatile memory;
a nonvolatile buffer memory that temporarily stores data to be written into the nonvolatile memory and data read from the nonvolatile memory;
a scrambler that scrambles data to be written with a scramble pattern generated by a scramble pattern generator when the data to be written is transferred between the nonvolatile memory and the buffer memory; and
a control portion that controls each of the error-correcting code generator, the error detection and correction portion, the nonvolatile buffer memory and the scrambler,
wherein when data is written into each write unit of the nonvolatile memory, the control portion controls so that the scrambled data to be written, a written flag serving as a bit pattern that differs from write unit to write unit, and the error-correcting code generated by the error-correcting code generator based on the scrambled data to be written and the written flag are written, and
when data of each write unit is read from the nonvolatile memory, the control portion decides whether data is normal or anomalous by judging whether a written flag area of the data after an error is corrected by the error detection and correction portion has the bit pattern corresponding to the data of each write unit read from the nonvolatile memory.

2. The nonvolatile memory controller according to claim 1, wherein the error-correcting code generator and the error detection and correction portion perform encoding so as to judge that there is no error if the data of each write unit read from the nonvolatile memory is not written yet.

3. The nonvolatile memory controller according to claim 2, further comprising an all-clear detector that detects whether the data of each write unit read from the nonvolatile memory is already all cleared.

4. The nonvolatile memory controller according to claim 2, wherein when the data of each write unit is read from the nonvolatile memory, and the written flag area does not have a predetermined bit pattern, the data is judged as normal if a number of bits corrected by the error detection and correction portion is less than a predetermined number of bits, and the data is judged as anomalous if the number of bits corrected by the error detection and correction portion is not less than the predetermined number of bits.

5. A nonvolatile memory device comprising:
a nonvolatile memory that comprises a storage area composed of a plurality of write units, stores data, and further comprises an area for storing a written flag area in each of the write units; and
a nonvolatile memory controller,
wherein the nonvolatile memory controller comprises:
an error-correcting code generator that generates an error-correcting code when data is written into the nonvolatile memory;
an error detection and correction portion that detects an error in data including the error-correcting code and corrects the error when data is read from the nonvolatile memory;
a nonvolatile buffer memory that temporarily stores data to be written into the nonvolatile memory and data read from the nonvolatile memory;
a scrambler that scrambles data to be written with a scramble pattern generated by a scramble pattern generator when the data to be written is transferred between the nonvolatile memory and the buffer memory; and
a control portion that controls each of the error-correcting code generator, the error detection and correction portion, the nonvolatile buffer memory and the scrambler,
wherein when data is written into each write unit of the nonvolatile memory, the control portion controls so that the scrambled data to be written, a written flag serving as a bit pattern that differs from write unit to write unit, and the error-correcting code generated by the error-correcting code generator based on the scrambled data to be written and the written flag are written, and
when data of each write unit is read from the nonvolatile memory, the control portion decides whether data is normal or anomalous by judging whether the written flag area of the data after an error is corrected by the error detection and correction portion has the bit pattern corresponding to the data of each write unit read from the nonvolatile memory.

6. The nonvolatile memory device according to claim 5, wherein the error-correcting code generator and the error detection and correction portion perform encoding so as to judge that there is no error if the data of each write unit read from the nonvolatile memory is not written yet.

7. The nonvolatile memory device according to claim 6, further comprising an all-clear detector that detects whether the data of each write unit read from the nonvolatile memory is already all cleared.

8. The nonvolatile memory device according to claim 6, wherein when the data of each write unit is read from the nonvolatile memory, and the written flag area does not have a predetermined bit pattern, the data is judged as normal if a number of bits corrected by the error detection and correction portion is less than a predetermined number of bits, and the data is judged as anomalous if the number of bits corrected by the error detection and correction portion is not less than the predetermined number of bits.

* * * * *